(12) United States Patent
De Sandre

(10) Patent No.: US 7,940,555 B2
(45) Date of Patent: May 10, 2011

(54) ROW DECODER FOR NON-VOLATILE MEMORY DEVICES, IN PARTICULAR OF THE PHASE-CHANGE TYPE

(75) Inventor: Guido De Sandre, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 69 days.

(21) Appl. No.: 12/548,246

(22) Filed: Aug. 26, 2009

(65) Prior Publication Data

US 2010/0054032 A1    Mar. 4, 2010

(30) Foreign Application Priority Data

Aug. 29, 2008 (IT) ............................ TO2008A0645

(51) Int. Cl.
*G11C 11/00* (2006.01)
*G11C 8/00* (2006.01)

(52) U.S. Cl. .................... 365/163; 365/230.03

(58) Field of Classification Search ........................ None
See application file for complete search history.

(56) References Cited

U.S. PATENT DOCUMENTS

| | | | |
|---|---|---|---|
| 6,233,198 B1 | 5/2001 | Choi | |
| 6,700,822 B1 * | 3/2004 | Wang | 365/189.05 |
| 6,714,478 B2 * | 3/2004 | Tomita et al. | 365/230.06 |
| 7,463,529 B2 * | 12/2008 | Matsubara | 365/185.23 |
| 2006/0203550 A1 | 9/2006 | Lee | |
| 2008/0106941 A1 | 5/2008 | Cho | |

* cited by examiner

*Primary Examiner* — Tan T. Nguyen

(74) *Attorney, Agent, or Firm* — Lisa K. Jorgenson; Robert Iannucci; Seed IP Law Group PLLC

(57) ABSTRACT

A hierarchical row decoder is for a phase-change memory device provided with an array of memory cells organized according to a plurality of array wordlines and array bitlines. The row decoder has a global decoder that addresses first and a second global wordlines according to first address signals; and a local decoder, which is operatively coupled to the global decoder and addresses a respective array wordline according to the value the first and second global wordline and second address signals. The local decoder has a first circuit branch providing, when the first global wordline is addressed, a first current path between the array wordline and a first biasing source during a reading operation; and a second circuit branch providing, when the second global wordline is addressed, a second current path, distinct from the first current path, between the array wordline and a second biasing source during a programming operation.

32 Claims, 4 Drawing Sheets

ROW DECODER FOR NON-VOLATILE MEMORY DEVICES, IN PARTICULAR OF THE PHASE-CHANGE TYPE

BACKGROUND

1. Technical Field

The present disclosure relates to a row decoder for non-volatile memory devices, in particular of the phase-change type, to which the following treatment will make particular reference, without this implying any loss of generality.

2. Description of the Related Art

Non-volatile phase-change memories (PCMs) are known, in which, for storing information, the characteristics of materials that have the property of switching between phases having different electrical characteristics are exploited. For example, these materials can switch between a disorderly amorphous phase and an orderly crystalline or polycrystalline phase, and the two phases are associated to resistivity of considerably different values, and consequently to a different value of a stored datum. For example, the elements of the Group VI of the periodic table, such as tellurium (Te), selenium (Se), or antimonium (Sb), referred to as chalcogenides or chalcogenic materials, can advantageously be used for producing phase-change memory cells. The phase changes are obtained by increasing locally the temperature of the cells of chalcogenic material, through resistive electrodes (generally known as heaters) set in contact with respective regions of chalcogenic material. Selection devices (for example, MOSFETs), are connected to the heaters, and enable the passage of a programming electrical current through a respective heater; this electrical current, by the Joule effect, generates the temperatures for the phase change. During reading, the state of the chalcogenic material is detected by applying a voltage that is sufficiently low as not to cause a marked heating, and then by reading the value of the current flowing in the cell. Given that the current is proportional to the conductivity of the chalcogenic material, it is possible to determine in which state the material is, and then determine to the data stored in the memory cells.

In a known manner, non-volatile memories include an array of memory cells organized in rows (wordlines) and columns (bitlines). Each memory cell is formed, in the case of PCMs, by a phase-change storage element and by a selector transistor, connected in series. In particular, a wordline is defined by the set of all the control terminals of the selector transistors aligned along one and the same row.

A column decoder and a row decoder, based on logic address signals received at their input and more or less complex decoding schemes, enable selection of the memory cells, and in particular of the corresponding wordlines and bitlines each time addressed, enabling biasing thereof to appropriate voltage and current values by corresponding biasing stages.

In the specific case of PCMs, it should be noted that the reading operations employ, as compared to the programming operations, values sensibly lower of the biasing voltage applied to the wordlines, especially if selector transistors of a MOS type are used (for example, 1.2 V in reading and 2.5 V in programming).

A memory array of PCM elements requires a significant static power for biasing the control terminals of the selector transistors connected to the selected row during a program pulse (much lower on gate terminals, in the case of MOS transistors, and higher on base terminals, in the case of bipolar transistors). Accordingly, it is clear that it is advantageous to reduce the number of storage elements (and associated selector transistors) connected to one and the same row. However, given that the row decoder requires a high area occupation, it is necessary to reach a compromise between the static power required in the row selection and the efficiency in the area occupation of the non-volatile memory device.

In the last few years, the use has been proposed, for non-volatile memory devices of a flash type, of a hierarchical row-decoding architecture. In general, even though many different embodiments have been presented, a hierarchical decoding is based on the use of at least two hierarchical row-decoding levels: a global level and a local level. The hierarchical architecture envisages the presence of global wordlines and of a plurality of local wordlines for each global wordline. A global row decoder addresses the global wordlines (i.e., it selects the global wordlines and biases the global wordlines each time selected), whilst each local row decoder addresses the local wordlines, and in particular enables connection between the addressed local wordline and the respective global wordline, enabling biasing of the wordlines of the memory array physically connected to the local wordlines.

For example, U.S. Pat. No. 6,233,198 discloses a high-density flash memory device using a hierarchical row-decoding architecture.

Even though this decoding architecture enables, as compared to traditional solutions, an improved compromise to be reached between the dynamic power used for biasing the selected wordlines and the area occupation of the row decoder, the power consumption levels still constitute an important design limitation, especially in the case of phase-change non-volatile memory devices.

BRIEF SUMMARY

One embodiment is a row decoder, in particular for a PCM device, that enables a solution to all or part of the problems associated to decoders of a known type, and is optimized as regards the electrical characteristics, with particular regard the specific requirements of PCMs.

One embodiment is a row decoder for a phase-change memory provided with an array of memory cells organized according to a plurality of array wordlines and array bitlines. The row decoder has a hierarchical architecture and includes first and second global wordlines; a global decoder configured to address the first and second global wordlines according to first address signals; and a local decoder, operatively coupled to the global decoder and configured to address a selected array wordline of the plurality of array wordlines according to values of the first and second global wordlines and of second address signals. The local decoder includes:

a first circuit branch configured to provide, when the first global wordline is addressed, a first current path between the selected array wordline and a first biasing source during a reading operation; and a second circuit branch configured to provide, when the second global wordline is addressed, a second current path, distinct from the first current path, between the selected array wordline and a second biasing source during a programming operation.

Embodiments also include a phase change memory with a row decoder and a system with a phase change memory.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

As will be described in detail in what follows, an aspect of the present disclosure envisages defining, in a hierarchical row-decoder architecture, two different current paths for selection of the wordlines of the memory array: a first path dedicated to the reading operations, and defined for this reason in what follows as "reading path"; and a second path dedicated to the programming operations, and defined for this reason in what follows as "programming path".

Figure 1:
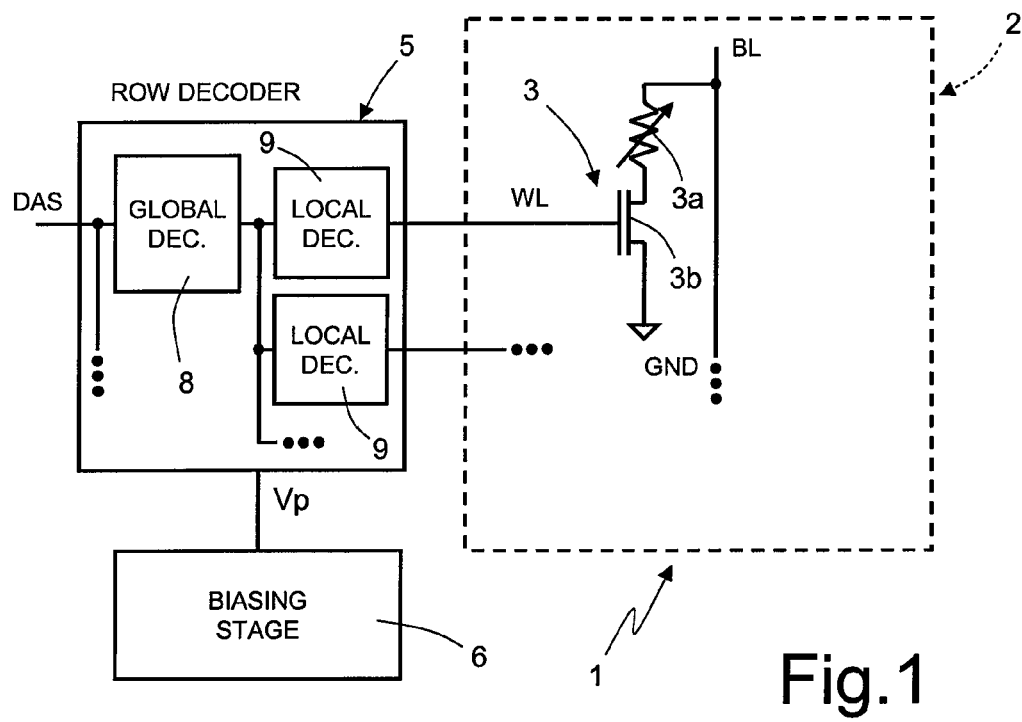
FIG. 1 shows a schematic circuit diagram of a portion of a non-volatile memory device, in particular of a PCM type.

In FIG. 1, a non-volatile memory device, in particular of a PCM type, designated as a whole by the reference number 1, is shown schematically, limitedly to just the parts that provide an understanding of the present disclosure.

In particular, the non-volatile memory device 1 comprises a memory array 2, constituted by a plurality of memory cells 3, arranged according to array wordlines WL and array bitlines BL. The memory cells 3 are identical to one another and comprise a phase-change element 3a and a selector element 3b, operatively coupled thereto. The phase-change element 3a includes a phase-change material (for example, a chalcogenide), and is hence able to store data in the form of resistance levels associated to the various phases assumed by the phase-change material (in FIG. 1, the phase-change element 3a is represented as a resistor with variable resistance). The selector element 3b, in the illustrated embodiment, is an NMOS transistor having its gate terminal connected to the array wordline WL, its drain terminal connected to the phase-change element 3a, and its source terminal connected to a reference potential (in particular ground, GND). The selector element 3b is controlled so as to enable, when selected, passage of a reading/programming current through the phase-change element 3a during respective reading/programming operations.

The non-volatile memory device 1 further comprises a row decoder 5, designed to select the array wordline WL corresponding to the memory cell 3 each time to be addressed, and a column decoder (not illustrated herein), designed to select the array bitline BL corresponding to the memory cell 3 to be addressed.

The row decoder 5 is set between the memory array 2 and a biasing stage 6, of a per-se known type, and receives decoded address signals, designated as a whole as DAS (Decoded Address Signal), generated in a known way that is not illustrated in detail, and biasing signals, designated in general by $V_p$. The row decoder 5 is configured so as to address a given array wordline WL, i.e., so as to select, on the basis of the decoded address signals DAS, the given array wordline WL, and so as to enable biasing thereof at a given electrical quantity, which is a function of the biasing signals $V_p$.

According to one embodiment, the row decoder 5 has a hierarchical architecture and comprises at least one global-row-decoder stage 8, designed to select a corresponding global wordline, and a plurality of local-row-decoder stages 9 for each global row decoder 8, operatively coupled to the global-row-decoder stage 8 and to the memory array 2, and designed to select, according to the value assumed by the respective global wordline, a specific array wordline WL.

In greater detail (FIG. 2), the global-row-decoder stage 8 receives at input a first block-address signal and a second block-address signal, which are generated, in a known way that is not described in detail, by an addressing stage (not illustrated), and are used for selecting a set of wordlines (for example, comprising 8 or 16 rows), according to an address-block decoding scheme. In particular, the global-row-decoder stage 8 receives: a low-voltage version of the block-address signals, GP_LV and D_LV, i.e., logic signals having voltages in the range [GND, $V_{DD}$], $V_{DD}$ being a first supply voltage, of a logic value of, for example, 1.2 V; a high-voltage (level-shifted) version of the block-address signals, GP, D, i.e., signals having voltages in the range [GND, $V_{CC}$], $V_{CC}$ being a second supply voltage, higher than the first supply voltage, of, for example, 3V; and a negated version of the block-address signals, with low and high voltage, GPN, DN, GPN_LV and DN_LV (in particular, the aforesaid block-address signals may have variations of value that are not simultaneous).

The global-row-decoder stage 8 comprises two distinct decoder circuits, which operate in parallel, and in particular a first decoder circuit 8a and a second decoder circuit 8b, designed to select and bias respectively a first global wordline MWL_LV, in a reading path of the addressed memory cells 3, and a second global wordline MWL, distinct from the first global wordline MWL_LV, in a programming path of the memory cells 3.

The first decoder circuit 8a comprises: a NAND logic gate 10, having a first input receiving the block-address signal GPN_LV and a second input receiving the block-address signal DN_LV; and an inverter 11, having its input connected to the output of the NAND logic gate 10, and its output connected to the first global wordline MWL_LV. In particular, the inverter 11 is formed by a PMOS pull-up transistor 12 and by an NMOS pull-down transistor 13, which are both low-voltage (LV) transistors (i.e., ones operating with voltages not higher than the first supply voltage $V_{DD}$) and have their gate terminals connected together and to the output of the NAND logic gate 10 and their drain terminals connected together and to the first global wordline MWL_LV; the PMOS pull-up transistor 12 also has its source terminal which receives the first supply voltage $V_{DD}$, whilst the source terminal of the NMOS pull-down transistor 13 is connected to ground. In use, according to the block-address signals received at its input, the first decoder circuit 8a selects the first global wordline MWL_LV, biasing it to a voltage value equal to the first supply voltage $V_{DD}$.

The second decoder circuit 8b comprises: an inverter 14, formed by a PMOS pull-up transistor 15 and by an NMOS pull-down transistor 16, which are both of a high-voltage (HV) type (i.e., ones operating with voltages with values up to the second supply voltage $V_{CC}$) and have their gate terminals connected together and receiving at input the block-address signal GP, and their drain terminals connected together and, at the output, to the second global wordline MWL; the PMOS pull-up transistor 15 also has its source terminal which receives the block-address signal DN, whilst the source terminal of the NMOS pull-down transistor 16 is connected to ground. The second decoder circuit 8b further comprises a CMOS switch 17, formed by the aforesaid PMOS pull-up transistor 15 and by an NMOS transistor 18, having its gate terminal which receives the block-address signal GPN, and its drain and source terminals connected to the respective terminals of the PMOS pull-up transistor 15. In use, according to the block-address signals received at its input, the second decoder circuit 8b selects the second global wordline MWL, biasing it to a voltage value equal to the second supply voltage $V_{CC}$.

In the circuit configuration described, during the reading operations the second global wordline MWL is kept at ground, whilst the first global wordline MWL_LV moves in the voltage range [0,$V_{DD}$], whilst during the programming operations, the first and second global wordlines MWL_LV, MWL move in parallel in the respective voltage ranges, modifying together their own values (the former being the version shifted downwards of the latter).

Figure 3:
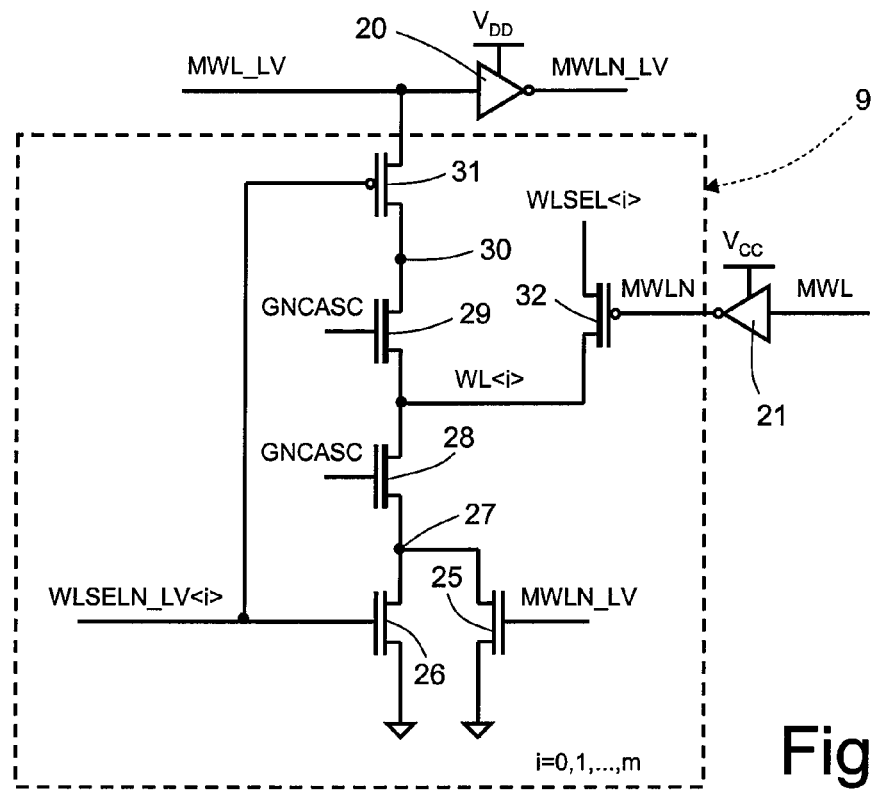
FIG. 3 shows a circuit diagram of a local row decoder in the memory device of FIG. 1, according to the first embodiment.

FIG. 3 shows a single local-row-decoder stage 9, designed to address a respective array wordline WL<i> of the memory array 2, where i=0, 1, ..., m, m being the number of wordlines and of local-row-decoder stages 9 driven by one and the same global-row-decoder stage 8 and by the same first and second global wordlines MWL_LV, MWL.

In detail, the local-row-decoder stage 9 receives at its input: the first and second global wordlines MWL_LV, MWL, from the respective global-row-decoder stage 8, and a negated version thereof MWLN_LV and MWLN, respectively, from a first inverting stage 20 and from a second inverting stage 21, the first of which operates in the low-voltage range [GND, $V_{DD}$] and the second in the high-voltage range [GND, $V_{CC}$]; and also row-address signals, WLSEL<i> and WLSELN_LV<i> (the latter being the low-voltage negated version of the former), used for selection of the rows of the memory array 2. In particular, the first and second inverting stages 20, 21 are in common between all the local row decoders 9 which receive the same global wordlines MWL_LV, MWL.

The local-row-decoder stage 9 comprises: a first pull-down transistor 25 and a second pull-down transistor 26, of a low-voltage NMOS type, which have their gate terminals receiving respectively the negated version MWLN_LV of the first global wordline and the row-address signal WLSELN_LV<i>, their source terminals connected to ground, and their drain terminals connected together and to a first intermediate node 27; and a first block transistor 28 and a second block transistor 29, of an NMOS high-voltage type, in cascode configuration, which receive at respective gate terminals a reference voltage GNCASC from the biasing stage 6. The first block transistor 28 has its source terminal connected to the first intermediate node 27, and its drain terminal connected to the array wordline WL<i> (at output to the local-row-decoder stage 9); the second block transistor 29 has its source terminal connected to the array wordline WL<i> and its drain terminal connected to a second intermediate node 30.

The local-row-decoder stage 9 further comprises a first pull-up transistor 31, of a low-voltage PMOS type, and a second pull-up transistor 32, of a high-voltage PMOS type. The first pull-up transistor 31 has its gate terminal, which is connected to the gate terminal of the second pull-down transistor 26 and receives the row-address signal WLSELN_LV<i>, its drain terminal connected to the second intermediate node 30, and its source terminal connected to the first global wordline MWL_LV; the second pull-up transistor 32 has its gate terminal which receives the negated version MWLN of the second global wordline, its source terminal which receives the row-address signal WLSEL<i>, and its drain terminal connected to the array wordline WL<i>.

In use, two distinct and separate current paths are generated inside the local-row-decoder stage 9, one for the reading operations and the other for the programming operations, and enabling of these paths is controlled not only by the row-address signals, but also by the value of the first global wordline MWL_LV and of the second global wordline MWL, respectively. In particular, the reading path is defined only by low-voltage MOS transistors, and in particular by the first and second pull-down transistors 25, 26 and by the first pull-up transistor 31, whilst the programming path is basically defined by the second pull-up transistor 32.

During a reading operation, the reference voltage GNCASC is brought to the high value $V_{CC}$, in this way opening a current path towards the first and second pull-down transistors 25, 26 and towards the first pull-up transistor 31. In this phase, the second global wordline MWL is kept at ground (GND), thus turning off the second pull-up transistor 32 and disconnecting the programming path. The selection of the array wordline WL<i> is thus controlled only by the first and second pull-down transistors 25, 26 and by the first pull-up transistor 31. In particular, the array wordline WL<i> is selected in reading (and appropriately biased to the value of the first supply voltage $V_{DD}$) when the first global wordline MWL_LV is brought to the high logic value $V_{DD}$ and moreover the row-address signal WLSELN_LV<i> is brought to ground (GND), thus generating a current path between the first global wordline MWL_LV and the array wordline WL<i> through the first pull-up transistor 31.

During a programming operation, the reference voltage GNCASC is brought to the high logic value $V_{DD}$, and the current path is disconnected through the first pull-up transistor 31. The control signals in the reading path are still active, and consequently connect the source terminal of the first block transistor 28 to ground; in addition, the first and second global wordlines MWL_LV, MWL move in parallel. The array wordline WL<i> is selected in programming (and hence appropriately biased) when both the second global line MWL and the row-address signal WLSEL<i> are brought to the high value $V_{CC}$, thus generating a current path towards the array wordline WL<i> through the second pull-up transistor 32. In this situation, the first and second block transistors 28, 29 protect the low-voltage transistors in the reading path from the high voltage present on the output.

Figure 4:
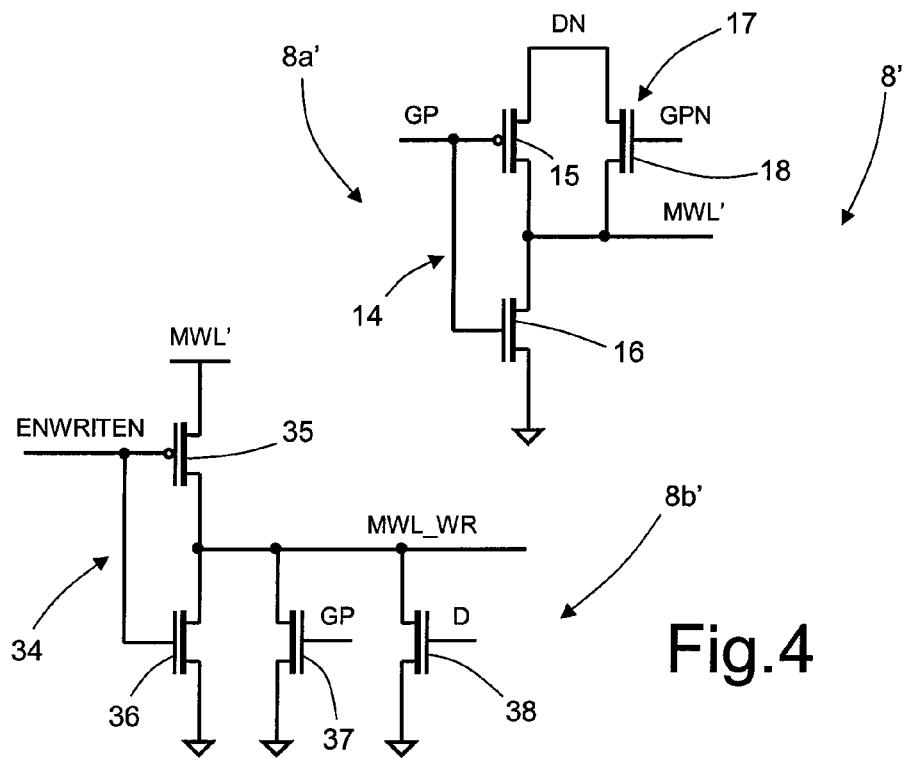
FIG. 4 shows a circuit diagram of a global row decoder in the memory device of FIG. 1, in a second embodiment.

FIG. 4 shows a second embodiment of the global-row-decoder stage, here designated by 8'.

Figure 2:
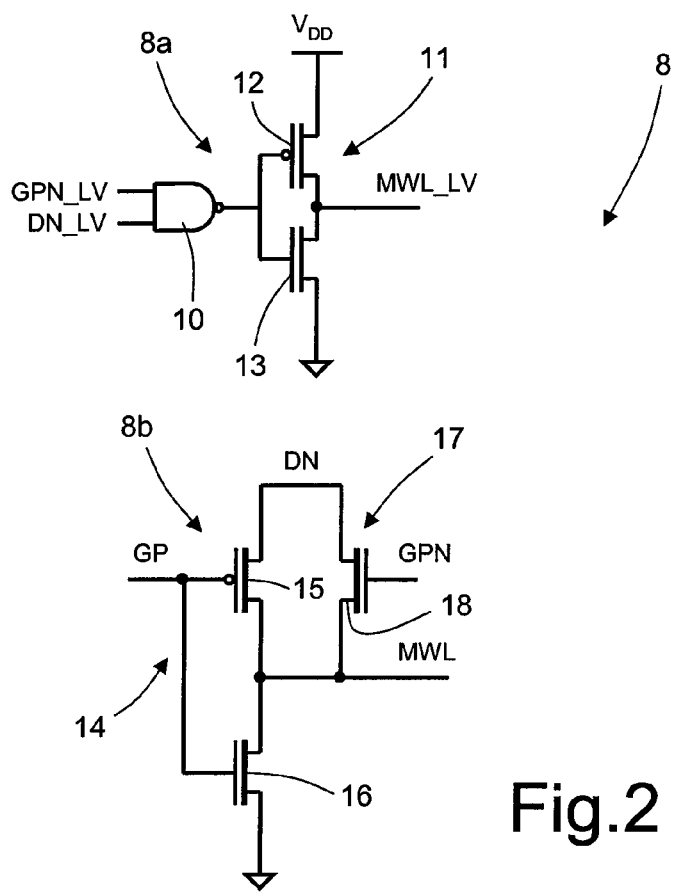
FIG. 2 shows a circuit diagram of a global row decoder in the memory device of FIG. 1, according to a first embodiment.

In detail, the first decoder circuit, here designated by 8a', has a circuit structure identical to that of the second decoder circuit 8b of FIG. 2 (so that the same reference numbers are used for identifying similar components). The first global wordline, here designated by MWL', has consequently a voltage dynamics [GND, $V_{CC}$] (i.e., it can assume a first voltage value equal to GND, when it is not selected, and a second voltage value equal to $V_{CC}$, when it is selected).

The second decoder circuit, here designated by 8b', comprises: an inverter 34, formed by a PMOS pull-up transistor 35 and by an NMOS pull-down transistor 36, both of a high-voltage type, which have their gate terminals connected together and receive at input a negated enable signal ENWRITEN (negated version of the enable signal ENWRITE), and drain terminals connected together and to the second global wordline, here designated by MWL_WR, at output to the second decoder circuit 8b'; the PMOS pull-up transistor 35 also has its source terminal connected to the first global wordline MWL', whilst the source terminal of the NMOS pull-down transistor 36 is connected to ground. The second decoder circuit 8b' moreover comprises two further NMOS pull-down transistors, both of a high-voltage type and connected between the second global wordline MWL_WR and ground: in particular, a first NMOS transistor 37 has its gate terminal which receives the block-address signal GP, whilst a second NMOS transistor 38 receives on a respective gate terminal the block-address signal D. In particular, the second global wordline MWL_WR is activated by the enable signal ENWRITE only during the programming operations, during which, moreover, the first and second global wordlines MWL', MWL_WR move in parallel.

Figure 5:
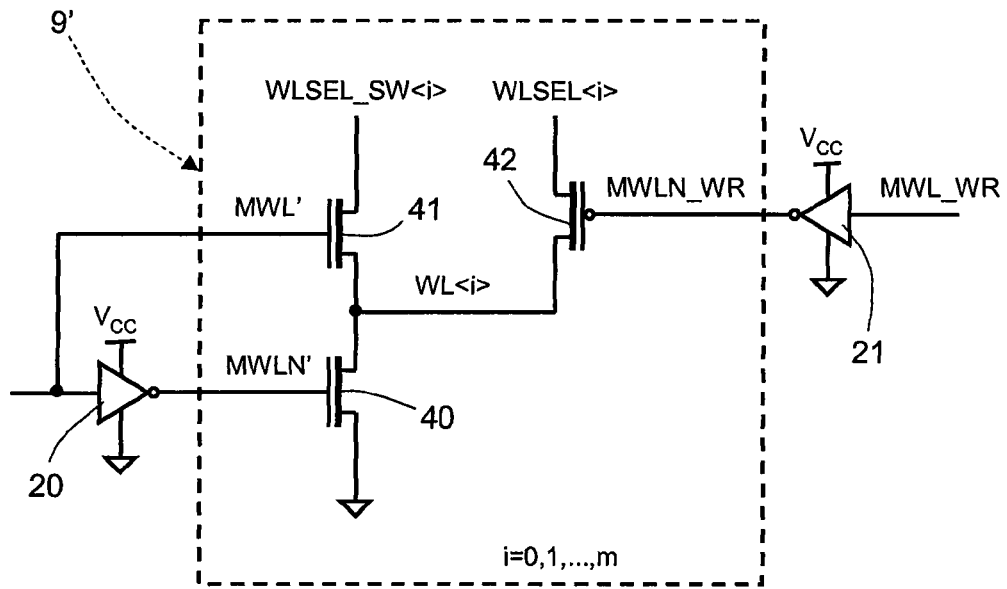
FIG. 5 shows a circuit diagram of a local row decoder in the memory device of FIG. 1, according to the second embodiment.

As is shown in FIG. 5, each local-row-decoder stage, here designated by 9' (once again, m local decoder stages 9' are provided for each global decoder stage 8') comprises: a pull-down transistor 40, of an NMOS high-voltage type, having its gate terminal which receives the negated version MWLN' of the first global wordline MWL' (generated locally via the first inverter stage 20), its source terminal connected to ground, and its drain terminal connected to the array wordline WL<i>; a first pull-up transistor 41, of a high-voltage NMOS type, having its gate terminal connected to the first global wordline MWL', its source terminal connected to the array wordline WL<i> and its drain terminal which receives a first row-address signal WLSEL_SW<i> (generated as will be described in detail in what follows); and a second pull-up transistor 42, of a high-voltage PMOS type, having its gate terminal connected to the negated version MWLN_WR of the second global wordline MWL_WR (generated locally via the second inverter stage 21), its source terminal connected to the array wordline WL<i> and its drain terminal which receives a second row-address signal WLSEL<i>. In particular, the first row-address signal WLSEL_SW<i> has a first voltage dynamics [GND; $V_{DD}$] during the reading operations, and a second voltage dynamics [GND; $V_{CC}$] during the programming operations; and the second row-address signal WLSEL<i> has voltage dynamics [GND; $V_{CC}$].

In this second embodiment, the reading path is formed by the pull-down transistor 40 and by the first pull-up transistor 41, both of an NMOS type. During a reading operation, the value of the second global wordline MWL_WR is kept low (the enable signal ENWRITE is kept at the low value), in such a way that its negated version MWLN_WR is brought to the high value $V_{CC}$, thus turning off the second pull-up transistor 42. The row selection is thus controlled only by the pull-down transistor 40 and by the first pull-up transistor 41: in particular, the i-th array wordline WL<i> of the memory array 2 is selected in reading (and appropriately biased to the high logic value $V_{DD}$) when the first global wordline MWL' is brought to the high value $V_{CC}$, and the corresponding first row-address signal WLSEL_SW<i> is brought to the high logic value $V_{DD}$.

During a programming operation, the second global wordline MWL_WR is activated by the enable signal ENWRITE, and consequently the first and second global wordlines MWL', MWL_WR modify together their value, undergoing substantially similar variations. The i-th array wordline WL<i> is selected in programming when both the first and the second global wordlines MWL', MWL_WR assume the high value $V_{CC}$ and moreover the second row-address signal WLSEL<i> is also brought to the high value $V_{CC}$. In addition, when the array wordline WL<i> is selected, the first row-address signal WLSEL_SW<i> is brought to the high value $V_{CC}$.

Figure 6:
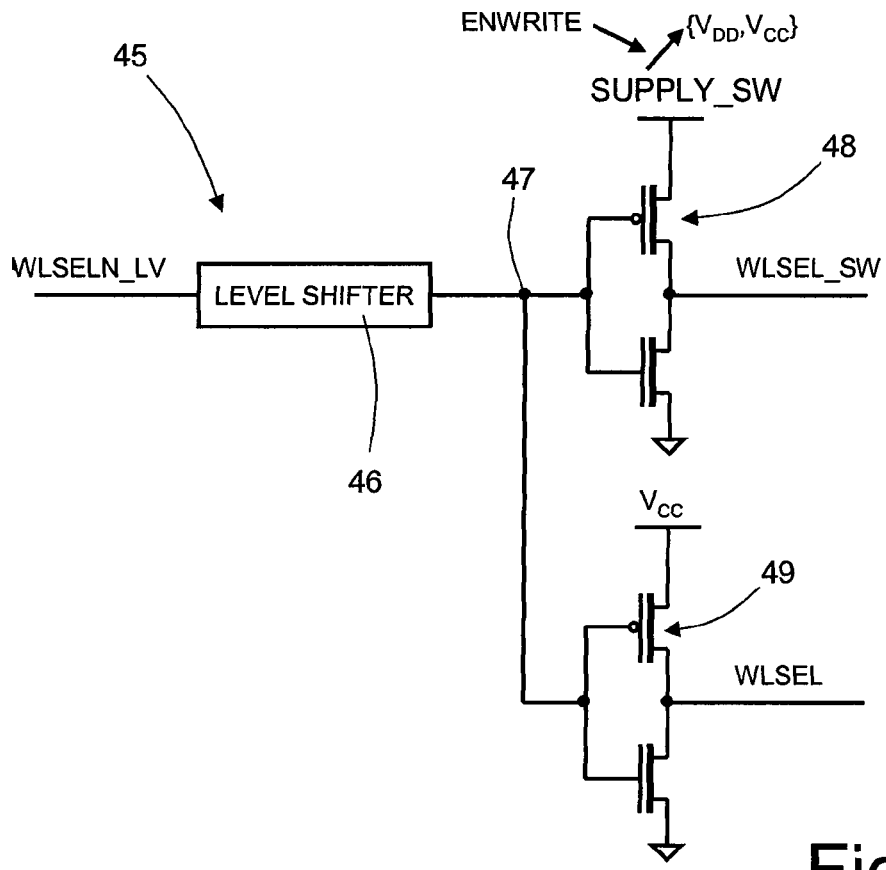
FIGS. 6 and 7 show two variant embodiments of a driver for the generation of address signals for the local row decoder of FIG. 5.

FIG. 6 shows a possible embodiment of a selection driver 45, for the generation of the first row-address signal WLSEL and of the second row-address signal WLSEL_SW.

In detail, the selection driver 45 comprises a level shifter 46, which receives at its input a negated low-voltage row-address signal WLSELN_LV, and supplies at its output, on an intermediate node 47, a version thereof shifted upwards (on the dynamics [0,$V_{CC}$]). The selection driver 45 further comprises, at its output, a first inverter stage 48 and a second inverter stage 49, both of which are formed by high-voltage NMOS and PMOS transistors (in a standard way, once again not described in detail herein). The first inverter stage 48 has a signal input connected to the intermediate node 47 and a supply input, which receives a supply signal SUPPLY_SW, corresponding alternatively to the first supply voltage $V_{DD}$ or to the second supply voltage $V_{CC}$, according to the value of the enable signal ENWRITE, as shown schematically in FIG. 6. The first inverter stage 48 supplies at its output the first row-address signal WLSEL_SW, which has, in the high state, alternatively the value $V_{CC}$ or $V_{DD}$, according to the value of the enable signal ENWRITE, and hence of the operation, whether reading or programming, to be carried out on the memory array 2. The second inverter stage 49 has a respective signal input connected to the intermediate node 47 and a respective supply input, which receives the second supply voltage $V_{CC}$, and supplies at its output the second row-address signal WLSEL, which hence has a dynamics of values [GND, $V_{CC}$].

Figure 7:
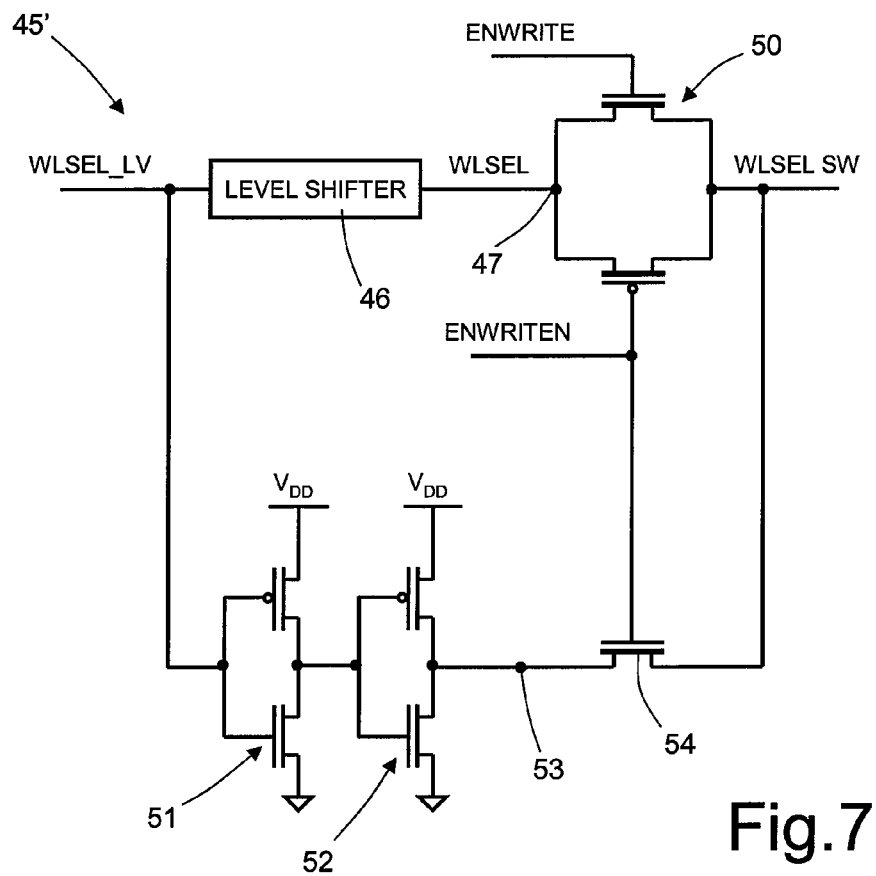

FIG. 7 shows a variant embodiment of the selection driver, here designated by 45'.

In detail, the selection driver 45' comprises: the level shifter 46, which in this case receives at its input the low-voltage row-address signal WLSEL_LV, and supplies on the intermediate node 47 the second row-address signal WLSEL; and a CMOS switch 50, of a high-voltage type, which is connected between the intermediate node 47 and the output of the selection driver 45', present on which is the first row-address signal WLSEL_SW, and receives at its control terminals the enable signal ENWRITE and the negated enable signal ENWRITEN. The selection driver 45' further comprises: a first inverter 51 and a second inverter 52, made with low-voltage NMOS and PMOS transistors, which are connected in series between the input of the selection driver 45' and an intermediate node 53, and which receive the first supply voltage $V_{DD}$ on a respective supply input; and an NMOS transistor 54, of a high-voltage type, having the function of "pass transistor", which is connected between the intermediate node 53 and the output of the selection driver 45', and receives on the gate terminal the negated enable signal ENWRITEN.

Also in this embodiment, the dynamics of the first row-address signal WLSEL_SW is directly dependent on the value of the enable signal ENWRITE (and hence on the reading or programming operation to be carried out). This embodiment has the advantage of not requiring a level shifting in the reading path (in particular, for taking the first row-address signal WLSEL_SW to the high logic value $V_{DD}$).

Figure 8:
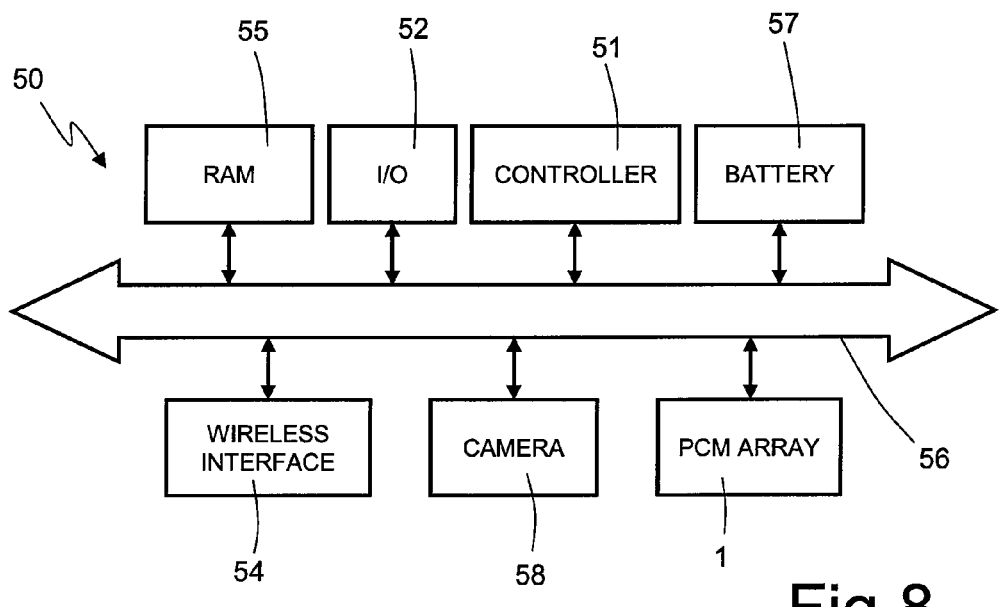
FIG. 8 is an overall block diagram of an electronic system incorporating the non-volatile memory device in a further embodiment.

FIG. 8 shows a portion of an electronic system 50, according to a further embodiment. The electronic system 50 can be used in electronic devices, such as for example: a PDA (Personal Digital Assistant); a portable or fixed computer, possibly with wireless data-transfer capacity; a mobile phone; a digital audio player; a photographic camera or a camcorder; or further devices able to process, store, transmit and receive information.

In detail, the electronic system 50 comprises: a controller 51 (for example, provided with a microprocessor, a DSP, or a microcontroller); an input/output device 52 (for example, provided with a keypad and a display), for input and display of data; the non-volatile memory device 1, provided with the array of memory cells 3 of the phase-change type, previously described; a wireless interface 54, for example, an antenna, for transmitting and receiving data through a radiofrequency wireless communication network; and a RAM 55, all coupled through a bus 56. A battery 57 can be used as electrical-supply source in the electronic system 50, which can further be provided with a photographic camera or camcorder 58.

From what has been described and illustrated previously, the advantages that the row decoder according to the present disclosure enables are evident.

In particular, the solution described enables exploitation of the peculiarities of a phase-change memory array, separating the row-decoding paths in reading and programming, guaranteeing a reduction in the static power used for row selection, and simultaneously reducing the dynamic power and improving the performance during reading operations.

In fact, it is possible to design in an optimized way the circuit components for row decoding in reading (in the first current path) irrespective of the electrical requirements for the programming operations. The size of the transistors involved in the operations of row decoding in reading can be limited, given that they are required to withstand voltages of a low value (not higher than the first supply voltage $V_{DD}$). The possible increase in size of the transistors can thus be limited to the programming path, in which, however, a compromise with performance is not required, given that the static power due to biasing in reading is substantially negligible. In particular, during reading the wordline is biased at low voltage, and hence there is no consumption of static power (the gate current of the selector is negligible), and sizing must take into account only the required dynamic power. Instead, during programming, sizing has to take into account also the static power. Consequently, it is clear the advantage afforded by the present solution as compared to a traditional solution in which the reading and programming paths coincide, and in which sizing for programming entails an increase in the dynamic power in reading on account of the higher parasitic capacitances.

Both of the embodiments described have specific advantages: in particular, the first embodiment described is advantageous in so far as, for row selection during the reading operations, only low-voltage transistors are used, and so a level shifting of the address signals is not required; the second embodiment described, although having a reading path only partially at low voltage, is advantageous in so far as it has a smaller area occupation for local row decoding. The use of just NMOS transistors in the reading path enables a greater circuit simplicity and a saving in the area occupation.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A row decoder, for a phase-change memory device provided with an array of memory cells organized according to a plurality of array wordlines and array bitlines, said row decoder having a hierarchical architecture and comprising:
    first and second global wordlines;
    a global decoder configured to address the first and second global wordlines according to first address signals; and
    a local decoder, operatively coupled to said global decoder and configured to address a selected array wordline of the plurality of array wordlines according to values of said first and second global wordlines and of second address signals, said local decoder including:
        a first circuit branch configured to provide, when said first global wordline is addressed, a first current path between said selected array wordline and a first biasing source during a reading operation; and
        a second circuit branch configured to provide, when said second global wordline is addressed, a second current path, distinct from said first current path, between said selected array wordline and a second biasing source during a programming operation.

2. The decoder according to claim 1, wherein said first biasing source is configured to supply a first biasing voltage, and said second biasing source is configured to supply a second biasing voltage having a value greater than said first biasing voltage.

3. The decoder according to claim 1, wherein said local decoder is configured to enable alternatively said first current path or said second current path, respectively during said reading operation and said programming operation.

4. The decoder according to claim 1, wherein said global decoder comprises:
    a first stage connected to, and configured to select and bias, said first global wordline; and
    a second stage, distinct from said first stage, connected to, and configured to select and bias, said second global wordline.

5. The decoder according to claim 1, wherein said second circuit branch comprises a pull-up transistor having a first conduction terminal connected to said array wordline, a second conduction terminal selectively connected to said second biasing source, and a control terminal coupled to said second global wordline.

6. The decoder according to claim 5, wherein: said pull-up transistor is a high-voltage PMOS transistor; said second circuit branch include an inverter coupling said control terminal of said pull-up transistor to said second global wordline; and said second conduction terminal of said pull-up transistor is configured to receive a given address signal among said second address signals, having a value equal to said second biasing voltage during said programming operation.

7. The decoder according to claim 1, wherein said first circuit branch comprises:
    a pull-up transistor having a first conduction terminal selectively connected to said array wordline and a second conduction terminal selectively connected to said first biasing source; and
    a first pull-down transistor having a first conduction terminal selectively connected to said array wordline and a second conduction terminal connected to a reference potential, and having a control terminal coupled to said first global wordline.

8. The decoder according to claim 7, wherein said first circuit branch further comprises a second pull-down transistor selectively connected between said array wordline and said reference potential, and has a control terminal configured to receive a selected address signal among said second address signals having a value equal to said reference potential during said reading operation; said pull-up transistor having a control terminal configured to receive said selected address signal during said reading operation and being selectively connected to said first biasing source through said first global wordline.

9. The decoder according to claim 7, wherein said local decoder further comprises two block transistors connected between said array wordline and, respectively, said pull-up transistor and said first pull-down transistor, and configured to selectively connect said pull-up transistor and, respectively, said first pull-down transistor to said array wordline.

10. The decoder according to claim 7, wherein said first global wordline and said first circuit branch are configured to operate in a voltage dynamic not higher than said first biasing voltage, said first circuit branch including low-voltage transistors.

11. The decoder according to claim 7, wherein said pull-up transistor has a control terminal connected to said first global wordline, and is configured to receive on said first conduction terminal a selected address signal from among said second address signals, having values that can switch between said first biasing voltage, during said reading operation, and said second biasing voltage, during said programming operation.

12. The decoder according to claim 11, wherein said global decoder is configured to receive an enable signal and to enable addressing of said second global wordline according to said enable signal; and wherein said respective address signal can switch according to said enable signal.

13. A phase-change memory device, comprising:
an array of memory cells organized according to a plurality of array wordlines and array bitlines;
a biasing stage; and
a row decoder configured to select said array wordlines and to provide a current path between said array wordlines and said biasing stage, the row decoder having a hierarchical architecture and including:
first and second global wordlines;
a global decoder configured to address the first and second global wordlines according to first address signals; and
a local decoder, operatively coupled to said global decoder and configured to address a selected array wordline of the plurality of array wordlines according to values of said first and second global wordlines and of second address signals, said local decoder including:
a first circuit branch configured to provide, when said first global wordline is addressed, a first current path between said selected array wordline and a first biasing source during a reading operation; and
a second circuit branch configured to provide, when said second global wordline is addressed, a second current path, distinct from said first current path, between said selected array wordline and a second biasing source during a programming operation.

14. The device according to claim 13, wherein each of said memory cells comprises: a phase-change region; and a transistor selector, operatively coupled to said phase-change region and having a control terminal connected to a respective one of said array wordlines.

15. The device according to claim 13, wherein said second circuit branch comprises a pull-up transistor having a first conduction terminal connected to said array wordline, a second conduction terminal selectively connected to said second biasing source, and a control terminal coupled to said second global wordline.

16. The device according to claim 15, wherein: said pull-up transistor is a high-voltage PMOS transistor; said second circuit branch include an inverter coupling said control terminal of said pull-up transistor to said second global wordline; and said second conduction terminal of said pull-up transistor is configured to receive a given address signal among said second address signals, having a value equal to said second biasing voltage during said programming operation.

17. The device according to claim 13, wherein said first circuit branch comprises:
a pull-up transistor having a first conduction terminal selectively connected to said array wordline and a second conduction terminal selectively connected to said first biasing source; and
a first pull-down transistor having a first conduction terminal selectively connected to said array wordline and a second conduction terminal connected to a reference potential, and having a control terminal coupled to said first global wordline.

18. The device according to claim 17, wherein said first circuit branch further comprises a second pull-down transistor selectively connected between said array wordline and said reference potential, and has a control terminal configured to receive a selected address signal among said second address signals having a value equal to said reference potential during said reading operation; said pull-up transistor having a control terminal configured to receive said selected address signal during said reading operation and being selectively connected to said first biasing source through said first global wordline.

19. The device according to claim 17, wherein said local decoder further comprises two block transistors connected between said array wordline and, respectively, said pull-up transistor and said first pull-down transistor, and configured to selectively connect said pull-up transistor and, respectively, said first pull-down transistor to said array wordline.

20. The device according to claim 17, wherein said first global wordline and said first circuit branch are configured to operate in a voltage dynamic not higher than said first biasing voltage, said first circuit branch including low-voltage transistors.

21. The device according to claim 17, wherein said pull-up transistor has a control terminal connected to said first global wordline, and is configured to receive on said first conduction terminal a selected address signal from among said second address signals, having values that can switch between said first biasing voltage, during said reading operation, and said second biasing voltage, during said programming operation.

22. The device according to claim 21, wherein said global decoder is configured to receive an enable signal and to enable addressing of said second global wordline according to said enable signal; and wherein said respective address signal can switch according to said enable signal.

23. An electronic system, comprising:
a controller; and
a phase-change memory device that includes:
an array of memory cells organized according to a plurality of array wordlines and array bitlines;
a biasing stage; and
a row decoder configured to select said array wordlines and to provide a current path between said array wordlines and said biasing stage, the row decoder having a hierarchical architecture and including:
first and second global wordlines;
a global decoder configured to address the first and second global wordlines according to first address signals; and
a local decoder, operatively coupled to said global decoder and configured to address a selected array wordline of the plurality of array wordlines according to values of said first and second global wordlines and of second address signals, said local decoder including:
- a first circuit branch configured to provide, when said first global wordline is addressed, a first current path between said selected array wordline and a first biasing source during a reading operation; and
- a second circuit branch configured to provide, when said second global wordline is addressed, a second current path, distinct from said first current path, between said selected array wordline and a second biasing source during a programming operation.

24. The system according to claim 23, further comprising an imaging device.

25. The system according to claim 23, wherein said second circuit branch comprises a pull-up transistor having a first conduction terminal connected to said array wordline, a second conduction terminal selectively connected to said second biasing source, and a control terminal coupled to said second global wordline.

26. The system according to claim 25, wherein: said pull-up transistor is a high-voltage PMOS transistor; said second circuit branch include an inverter coupling said control terminal of said pull-up transistor to said second global wordline; and said second conduction terminal of said pull-up transistor is configured to receive a given address signal among said second address signals, having a value equal to said second biasing voltage during said programming operation.

27. The system according to claim 23, wherein said first circuit branch comprises:
- a pull-up transistor having a first conduction terminal selectively connected to said array wordline and a second conduction terminal selectively connected to said first biasing source; and
- a first pull-down transistor having a first conduction terminal selectively connected to said array wordline and a second conduction terminal connected to a reference potential, and having a control terminal coupled to said first global wordline.

28. The system according to claim 27, wherein said first circuit branch further comprises a second pull-down transistor selectively connected between said array wordline and said reference potential, and has a control terminal configured to receive a selected address signal among said second address signals having a value equal to said reference potential during said reading operation; said pull-up transistor having a control terminal configured to receive said selected address signal during said reading operation and being selectively connected to said first biasing source through said first global wordline.

29. The system according to claim 27, wherein said local decoder further comprises two block transistors connected between said array wordline and, respectively, said pull-up transistor and said first pull-down transistor, and configured to selectively connect said pull-up transistor and, respectively, said first pull-down transistor to said array wordline.

30. The system according to claim 27, wherein said first global wordline and said first circuit branch are configured to operate in a voltage dynamic not higher than said first biasing voltage, said first circuit branch including low-voltage transistors.

31. The system according to claim 27, wherein said pull-up transistor has a control terminal connected to said first global wordline, and is configured to receive on said first conduction terminal a selected address signal from among said second address signals, having values that can switch between said first biasing voltage, during said reading operation, and said second biasing voltage, during said programming operation.

32. The system according to claim 27, wherein said global decoder is configured to receive an enable signal and to enable addressing of said second global wordline according to said enable signal; and wherein said respective address signal can switch according to said enable signal.

* * * * *